United States Patent
Maehara et al.

(10) Patent No.: US 10,438,942 B2
(45) Date of Patent: Oct. 8, 2019

(54) FIELD-EFFECT TRANSISTOR WITH PROTECTION DIODES

(71) Applicant: Mitsubishi Electric Corporation, Tokyo (JP)

(72) Inventors: Hiroaki Maehara, Tokyo (JP); Miyo Miyashita, Tokyo (JP); Kazuya Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 111 days.

(21) Appl. No.: 15/279,637

(22) Filed: Sep. 29, 2016

(65) Prior Publication Data

US 2017/0229445 A1 Aug. 10, 2017

(30) Foreign Application Priority Data

Feb. 9, 2016 (JP) .................................. 2016-022499

(51) Int. Cl.
*H01L 27/02* (2006.01)
*H01L 23/535* (2006.01)
(Continued)

(52) U.S. Cl.
CPC ...... *H01L 27/0266* (2013.01); *H01L 21/8252* (2013.01); *H01L 23/535* (2013.01);
(Continued)

(58) Field of Classification Search
CPC ............... H01L 21/8252; H01L 23/535; H01L 27/0248; H01L 27/0251; H01L 27/0266;
(Continued)

(56) References Cited

U.S. PATENT DOCUMENTS

| 5,552,335 A | * | 9/1996 | Mahon | ................ H01L 21/8252 |
| | | | | 257/E21.697 |
| 2002/0018328 A1 | * | 2/2002 | Nakamura | .......... H01L 27/0255 |
| | | | | 361/91.5 |

(Continued)

FOREIGN PATENT DOCUMENTS

| JP | Sho59-100579 A | 6/1984 |
| JP | H02-283070 A | 11/1990 |

(Continued)

OTHER PUBLICATIONS

An Office Action; "Notification of Reason for Refusal," mailed by the Korean Intellectual Property Office dated Dec. 19, 2017, which corresponds to Korean Patent Application No. 10-2017-0016174 and is related to U.S. Appl. No. 15/279,637; with English translation.

(Continued)

*Primary Examiner* — Kevin J Comber
(74) *Attorney, Agent, or Firm* — Studebaker & Brackett PC

(57) ABSTRACT

A field-effect transistor with protection diodes includes: a field-effect transistor; and a two-terminal electrostatic protection circuit connected between a gate and a source of the field-effect transistor, wherein the two-terminal electrostatic protection circuit comprises: a first diode that is positioned on a reverse-biased side when a voltage lower than a potential of the source is applied to the gate and has a reverse withstand voltage lower than a reverse withstand voltage between the gate and the source of the field-effect transistor; a second diode that is positioned on a forward-biased side when a voltage lower than a potential of the source is applied to the gate and is connected in anti-series to the first diode; and a resistor that is connected in series to a diode pair comprising the first diode and the second diode and formed (Continued)

using a same channel layer as that of the field-effect transistor.

17 Claims, 15 Drawing Sheets

(51) Int. Cl.
  *H01L 27/06* (2006.01)
  *H01L 21/8252* (2006.01)
  *H01L 29/20* (2006.01)
  *H01L 29/872* (2006.01)
  *H01L 29/778* (2006.01)
  *H01L 29/8605* (2006.01)

(52) U.S. Cl.
  CPC ...... *H01L 27/0248* (2013.01); *H01L 27/0288* (2013.01); *H01L 27/0605* (2013.01); *H01L 27/0629* (2013.01); *H01L 27/0251* (2013.01); *H01L 29/2003* (2013.01); *H01L 29/7786* (2013.01); *H01L 29/8605* (2013.01); *H01L 29/872* (2013.01)

(58) Field of Classification Search
  CPC ............ H01L 27/0288; H01L 27/0605; H01L 27/0629; H01L 28/20; H01L 29/2003; H01L 29/7786; H01L 29/8605; H01L 29/872
  USPC .......................................... 361/56
  See application file for complete search history.

(56) References Cited

U.S. PATENT DOCUMENTS

| | | | |
|---|---|---|---|
| 2008/0062595 A1* | 3/2008 | Ping | H01L 27/0266 361/56 |
| 2009/0021873 A1 | 1/2009 | Spode et al. | |
| 2011/0080192 A1* | 4/2011 | Ogawa | H03K 17/04123 327/109 |
| 2015/0243737 A1 | 8/2015 | Escoffier | |

FOREIGN PATENT DOCUMENTS

| | | |
|---|---|---|
| JP | 2001-332567 A | 11/2001 |
| JP | 2010-503217 A | 1/2010 |
| JP | 2015-181154 A | 10/2015 |
| KR | 10-2001-0107608 A | 12/2001 |
| KR | 10-0794151 B1 | 1/2008 |
| KR | 10-2008-0085226 A | 9/2008 |

OTHER PUBLICATIONS

Akira Inoue et al., (2006) "A Nonlinear Drain Resistance Model for a High Power Millimeter-wave PHEMT", IEEE International Microwave Symp., pp. 647-650.

An Office Action mailed by the Korean Intellectual Property Office dated Oct. 4, 2018, which corresponds to Korean Patent Application No. 10-2018-0087246, which is the divisional patent application of the corresponding Korean Patent Application No. 10-2017-0016174, and is related to U.S. Appl. No. 15/279,637; with English translation.

An Office Action mailed by the Korean Intellectual Property Office dated Jun. 27, 2018, which corresponds to Korean Patent Application No. 10-2017-0016174 and is related to U.S. Appl. No. 15/279,637; with English translation.

Dong Myong Kim; "Semiconductor Engineering: Principles of Semiconductors Explained with Pictures", HanBit Academy, Feb. 27, 2015, pp. 449, Republic of Korea; with partial English translation.

* cited by examiner

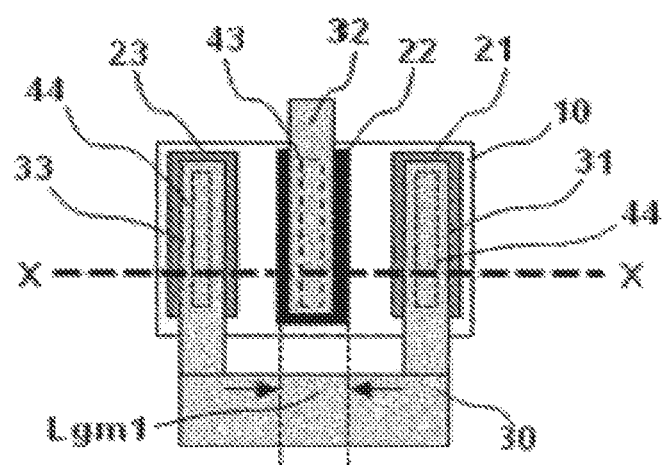

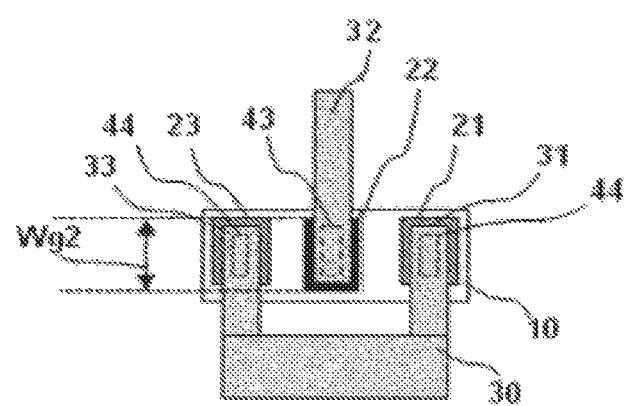

_US 10,438,942 B2_

FIELD-EFFECT TRANSISTOR WITH PROTECTION DIODES

BACKGROUND OF THE INVENTION

Field

The present invention relates to an improvement of electrostatic discharge (ESD) resistance of a field-effect transistor (FET) used in a microwave band/millimeter wave band.
Background In recent years, application of GaN-based FET amplifiers featuring high withstand voltage, high output and low thermal resistance to microwave/millimeter wave hands is progressing in the fields of mobile phone base stations, satellite communication amplifiers and radar amplifiers. However, although the GaN-based FETs exhibit sufficiently high two-terminal and three-terminal withstand voltage characteristics compared to conventional GaAs-based FETs, in terms of liability to failures caused by ESD (static electricity discharge), the resistance of the GaN-based FETs cannot be said to he sufficiently high. For example, ESD resistance of GaN-based FETs often has been proven to be on the order of 250 to 500 V according to human model (HBM) tests. In assembly of semiconductor devices and in actual use after mounting on printed circuit boards, minimizing ESD malfunction generally requires resistance of 1 kV or higher in HBM tests. In not only GaN-based FETs but also conventionally used GaAs-based FETs, insufficient ESD resistance (resistance to ESD-caused malfunction) often has been questioned in actual use.

CITATION LIST

Patent Literature 1: JP 2001-332567 A
Patent Literature 2: JP 59-100579 A
Non Patent Literature 1: 2006 IEEE International Microwave Symp., pp. 647-650, "A Nonlinear Drain Resistance Model for a High Power Millimeter-wave PHEMT"

SUMMARY

As described above, against the technical background, several solutions have been disclosed so far. Patent Literature 1 and Patent Literature 2 describe an ESD protective circuit using a Schottky junction diode between a gate terminal and a source terminal of a GaAs FET.

For example, according to a configuration in FIG. 11A described in Patent Literature 1, when an excessive gate voltage is applied to a gate-source Schottky junction in a positive direction, it is possible to prevent malfunction caused by an overcurrent flowing through diodes Da1 and Da2, and an overcurrent flowing through the gate-source Schottky junction of an FET F1. When a negative surge is applied to the gate, a surge current passes through diodes Db1 and Db2, and it is thereby possible to protect the gate-source Schottky junction of the FET F1. However, such a configuration poses a problem that the gain is reduced when an FET amplifier is constructed of a capacitance of the junction of the diodes connected in anti-parallel.

In the case of a GaAs-based or GaN-based FET, since a depression type (normally on type) is generally used, the depression type is used by applying a negative gate bias thereto. For example, in the case of a GaN FET, its threshold voltage is as deep as −2 V to −4 V and its gate bias voltage during amplification operation is also as deep as −1.5 V to −3 V. For this reason, to prevent current from flowing through the protective circuit: even during RF signal amplification operation, if a GaN gate-source Schottky barrier potential is assumed to be approximately 1 V, a longitudinal stack of at least five stages is required as shown by reverse diodes Db1 to Db5 in FIG. 11B. This involves a problem that the occupancy area of the protective circuit increases and prevents the FET chip from being downsized.

The configuration in FIG. 11C described in Patent Literature 2 provides ESD protection Schottky junction diodes connected in anti-series, thereby eliminates the need for the multi-stage connection as shown in FIG. 11B, and the Db1 is reversely biased when a negative bias voltage is applied thereto, and it is thereby possible to drastically reduce increases in capacitances by the Da1 and Db1. However, the reverse current capacity of a Schottky junction diode is generally extremely small compared to the reverse current capacity of a pn junction diode, and such a configuration poses a problem that a reverse overcurrent, when a negative surge is applied, causes the protection diode itself to malfunction.

It is an object: of the present invention to provide a small FET with protection diodes having a function of suppressing malfunction (burning) of the protection diodes connected in anti-series within a preset negative gate surge current range, and capable of suppressing a gain reduction during amplification operation.

According to the present invention, a field-effect transistor with protection diodes includes: a field-effect transistor; and a two-terminal electrostatic protection circuit connected between a gate and a source of the field-effect transistor, wherein the two-terminal electrostatic protection circuit comprises: a first diode that is positioned on a reverse-biased side when a voltage lower than a potential of the source is applied to the gate and has a reverse withstand voltage lower than a reverse withstand voltage between the gate and the source of the field-effect transistor; a second diode that is positioned on a forward-biased side when a voltage lower than a potential of the source is applied to the gate and is connected in anti-series to the first diode; and a resistor that is connected in series to a diode pair comprising the first diode and the second diode and formed using a same channel layer as that of the field-effect transistor.

The FET with protection diodes according to the present invention can prevent the diodes inside the protective circuit from malfunctioning due to an overcurrent by a current saturation characteristic of a resistor provided in the protective circuit and also allows surge resistance between the gate and the source of the FET to be used to pass a gate surge current. As a result, the present FET has an effect of being able to reduce the size (junction area) of the diodes in the protective circuit. Moreover, since a pair of diodes connected in anti-series is used for the protective circuit, the junction capacitance added between the gate and the source is small, and it is thereby possible to prevent a gain reduction when an FET amplifier is composed.

Other and further objects, features and advantages of the invention will appear more fully from the following description.

BRIEF DESCRIPTION OF DRAWINGS

FIG. 7A is a layout diagram of a protection diode according to a fifth embodiment of the present invention.

FIG. 9B is a layout example of the diode Da1 in FIG. 1.

DESCRIPTION OF EMBODIMENTS

A FET with protection diodes according to the embodiments of the present invention will be described with reference to the drawings. The same components will be denoted by the same symbols, and the repeated description thereof may be omitted.

First Embodiment (Description of Configuration)

Figure 1:
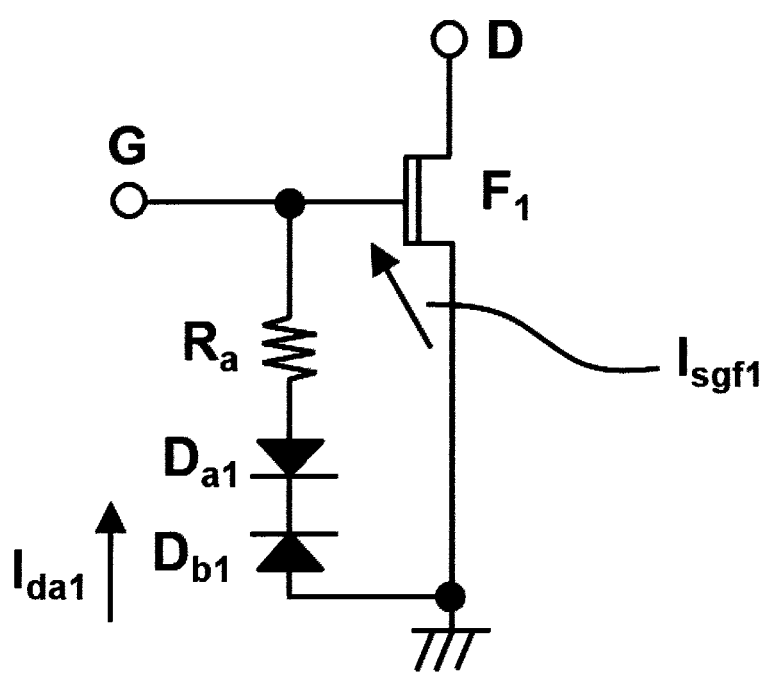
FIG. 1 is an example of a circuit diagram of an FET with protection diodes according to a first embodiment of the present invention.

FIG. 1 is an example of a circuit diagram of an FET with protection diodes according to a first embodiment of the present invention. In FIG. 1, a forward diode Da1 having a polarity the same direction as that of a Schottky junction diode between a gate and a source of an FET F1 and a reverse diode Db1 having a polarity in the reverse direction are connected in anti-series to each other. Furthermore, a resistor Ra is connected in series to the pair of diodes (Da1 and Db1) connected in anti-series to each other. An ESD protective circuit is constructed of the Da1, the Db1 and the Ra, and is connected in parallel between the gate and the source of the FET F1. Here, it is a feature of the present invention that the resistor Ra is a channel resistor formed of the same layer as that of a channel of the FET F1 or a resistor having a property equivalent thereto (current saturation characteristic). Note that the current saturation characteristic refers to a characteristic in which when a voltage exceeding a certain voltage value is applied to both ends of a resistor, the current exhibits not an ohmic characteristic but a substantially fixed current value as shown in FIG. 3B.

Figure 2A:
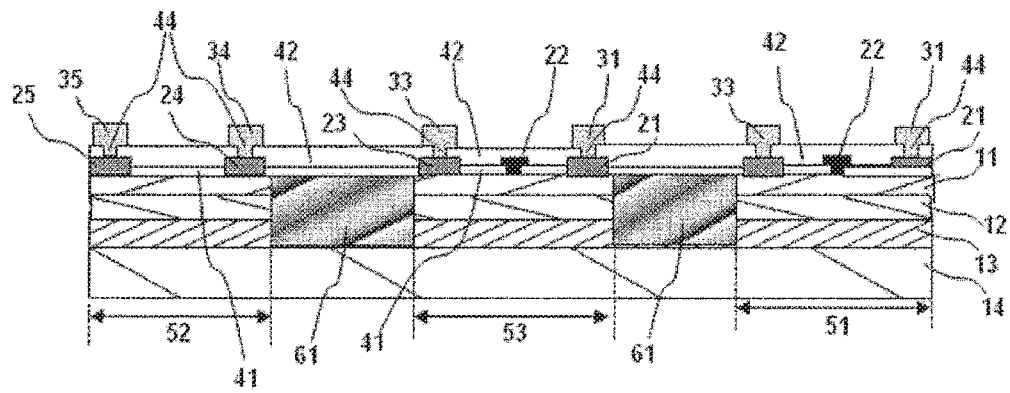
FIG. 2A is a cross-sectional structure diagram of the FET, the diode and the channel resistor of the circuit in FIG. 1.
Figure 2B:
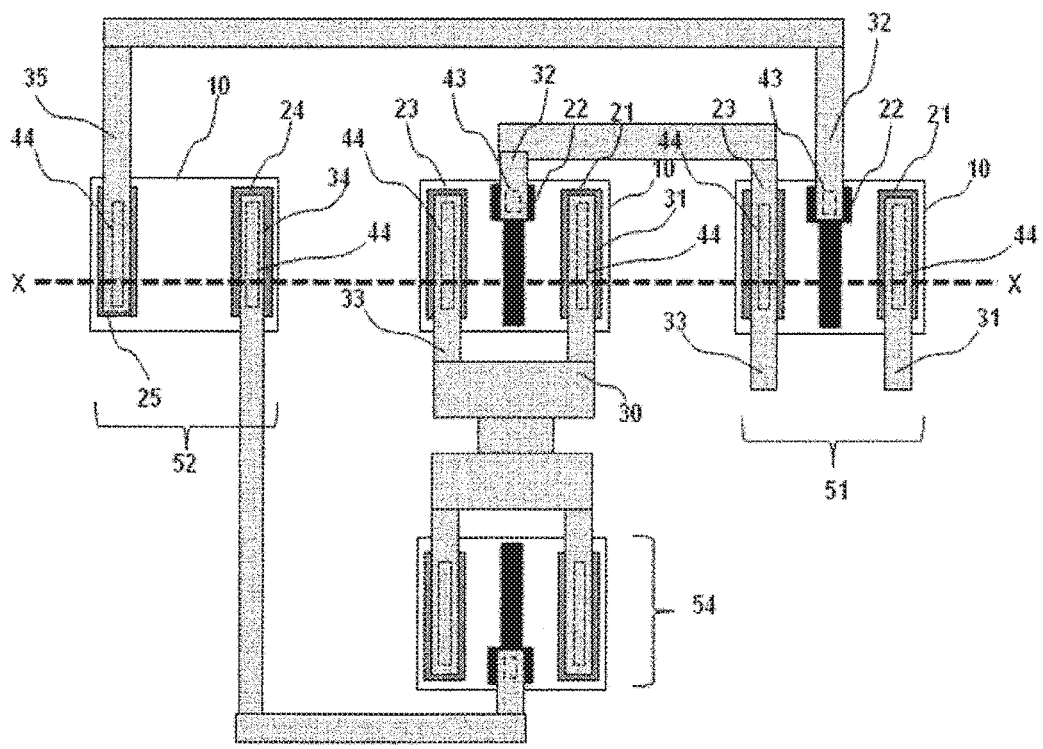
FIG. 2B is a layout of the circuit in FIG. 1.

FIG. 2A is a cross-sectional structure diagram of the FET, the diode Db1 and the channel resistor Ra of the circuit in FIG. 1, FIG. 2B is a layout of the circuit in FIG. 1. The cross-sectional structure diagram in FIG. 2A is a cross-sectional structure diagram along a plane X-X in FIG. 2B. Since the cross-sectional structure diagram of the diode Da1 is the same as that of the diode Db1, it is not shown in FIG. 2A, shown in FIG. 2A, a buffer layer 13 is provided on a semiconductor substrate 14 such as SiC or Si, and a GaN layer 12 and an AlGaN layer 11 are provided thereon. An FET region 51, a diode (Db1) region 53 and a resistor region 52 are separated from each other by a separation region 61 formed using ion implantation or the like.

A drain electrode 21, a gate electrode 22 and a source electrode 23 are on AlGaN in the FET region 51. Resistor electrodes 24 and 25 are on AlGaN of the resistor region 52. To improve a withstand voltage, a structure may also be provided in which both ends of the gate electrode 22 are "stranded on" an insulating film 41. An insulating film 42 is a protective film that covers the electrode, a drain lead wire 31 which is a first layer wire is connected to the drain electrode 21 via a contact hole 44 on the insulating film 42, a gate lead wire 32 which is the first layer wire is connected to the gate electrode 22 via contact hole 43 on the insulating film 42, and a source lead wire 33 which is the first layer wire is connected to the source electrode 23 via a contact hole 44 on the insulating film 42.

Similarly, the resistor electrodes 24 and 25 are connected to first layer wires 34 and 35 via the contact hole 44 on the insulating film 42. The resistor Ra which is the feature of the present invention is for med of a channel made up of the AlGaN layer 11 and the GaN layer 12 as in the case of the FET section to obtain the saturation current characteristic. Note that the saturation current characteristic which is the feature of the present invention can be obtained also by performing ion implantation with Si or the like on the channel section of the resistor appropriately and adjusting the sheet resistance value.

(Description of Characteristics of Diode and Resistor)

Figure 3A:
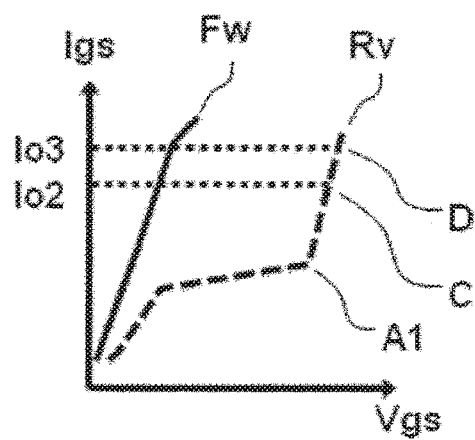
FIG. 3A illustrates an example of a forward current-voltage characteristic (Fw), and an example of a reverse current-voltage characteristic (Rv) of the Schottky junction diode between the gate and source of the FET.
Figure 3B:
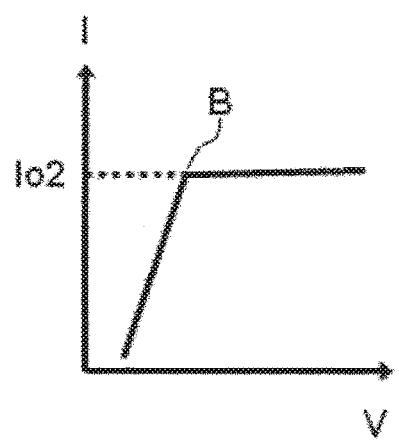
FIG. 3B illustrates an example of a current-voltage characteristic of the channel resistor.
Figure 3C:
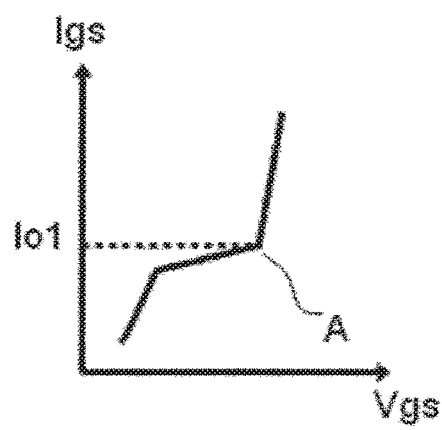
FIG. 3C illustrates an example of a reverse current-voltage characteristic of the diodes formed of a Schottky junction.
Figure 3D:
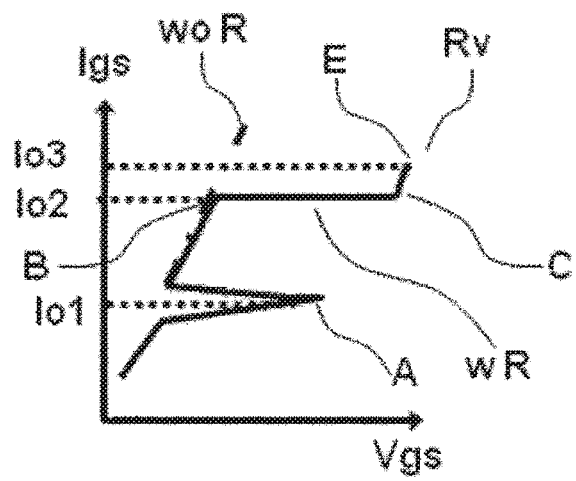
FIG. 3D illustrates an example of a current-voltage characteristic when a negative surge is applied to the gate of the FET with a protective circuit in FIG. 1.
Figure 3E:
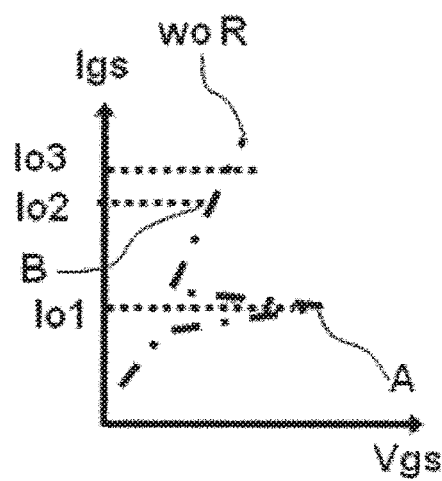
FIG. 3E illustrates a comparative example of a current-voltage characteristic when a negative surge is applied to the gate of the FET with a protective circuit in FIG. 1 without the resistor.

FIG. 3A illustrates an example of a forward current-voltage characteristic (Fw), and an example of a reverse current-voltage characteristic (Rv) of the Schottky junction diode between the gate and source of the FET F1. In FIG. 3A, the vertical axis shows an anode-cathode (gate and source) current and the horizontal axis shows an anode-cathode voltage. FIG. 3B illustrates an example of a current-voltage characteristic of the channel resistor Ra, the vertical axis showing a current flowing through the resistor and the horizontal axis showing a voltage applied to both ends of the resistor. FIG. 3C illustrates an example of a reverse current-voltage characteristic of the diodes Da1 and Db1 formed of a Schottky junction, the vertical axis showing a current and the horizontal axis showing a reverse voltage. A difference in the reverse withstand voltage between FIGS. 3A and 3C is that reverse withstand voltages of the Da1 and the Db1 in FIG. 3C are lower than the gate-source withstand voltage of the FET F1 in FIG. 3A. In other words, the circuit is manufactured so that the reverse withstand voltages of the Da1 and the Db1 are lower than the gate-source withstand voltage of the FET F1. FIG. 3D illustrates an example of a current-voltage characteristic when a negative surge is applied to the gate of the FET with a protective circuit in FIG. 1, the vertical axis showing a current and the horizontal axis showing a voltage. FIG. 3E illustrates a comparative example of a current-voltage characteristic when a negative surge is applied to the gate of the FET with a protective circuit in FIG. 1 without the resistor Ra, the vertical axis showing a current and the horizontal axis showing a voltage, Note that in FIG. 3, point A1 is a point at which breakdown starts in a gate-source reverse direction of the FET F1, point C is a point at which the breakdown reverse current reaches Io2, point E is a point at which the breakdown reverse current reaches Io3 and point B is a point at which a current reaches saturation with respect to the voltage between both ends of the resistor. Point A is a point at which the diodes Da1 and Db1 start breakdown in the reverse direction, Io1 is a reverse current value at that time, point B is a point at which a current that has been snapped back at point A when a negative surge is applied reaches Iot in the protective circuit made up of the Da1, the Db1 and the Ra1 in FIG. 1.

Using this difference in the withstand voltage, the diode Db1 is subjected to breakdown ahead of the FET F1 when a negative gate surge is applied. Note that when practicality is taken into consideration, the difference in the withstand voltage is preferably lower by on the order of 5 to 10 V. A feature of the characteristic of the channel resistor formed of the same layer as that of the FET F1 shown in FIG. 3B is that the current reaches saturation when a voltage equal to or higher than a certain voltage is applied thereto. This is similar to a static characteristic of a drain-source voltage with respect to the drain current of the FET.

(Description of Operation)

Next, operation when a negative gate surge (a voltage lower than the source potential is applied to the gate) is applied between the gate and source will be described using the example of the current-voltage characteristic shown in FIG. 3D. For the surge, a human body model (HBM) which is most widely used as a standard for ESD resistance is assumed. When the surge is applied, the Db1 is subjected to breakdown at a voltage at point A as shown by a solid line (wR) in FIG. 3D and a snapback occurs. After the snap back, the current increases and reaches point B. When the current reaches point B, the current is limited to Io2 due to the current saturation characteristic of the resistor Ra, and the voltage then increases up to point C. When the voltage increases up to point C, the gate-source reverse junction of the FET F1 is subjected to breakdown and the current reaches Io3. As long as the difference between the currents Io3 and Io2 is lower than the current resistance between the gate and the source of the FET F1, the circuit in FIG. 1 can keep the desired surge current Io3 flowing without destroying the gate-source junction of the FET F1.

As a specific example, a case will be considered where an HBM surge resistance of 1 kV is protected. When the reverse direction surge resistance possessed by the FET F1 is assumed to be 250 V, the current that is allowed to flow between the gate and the source of the F1 is 250 V/1.5 k$\Omega$=0.17 A. Since 1 kV/1.5 k$\Omega$=0.67 A, in order for the circuit in FIG. 1 to possess the resistance of 1 kV, a current of 0.5 A may be made to flow through the ESD protective circuit (Da1, Db1, Ra). Here, 1.5 k$\Omega$ is a resistance value of a test system used to measure the ESD resistance in HBM.

If a reverse current capacity per unit area of the Schottky junction acquired by an experiment in advance is assumed to be, for example, 0.2 A/1 mm$^2$, a junction area necessary to pass 0.5 A is calculated to be 2.5 mm$^2$. On the other hand, regarding the resistor, in the case where the saturation current per unit width is 2.5 A/min, a saturation current characteristic of 0.5 A can be achieved using a channel resistor having a width of 0.2 mm. When the circuit is designed in this way, a current Ida1 that flows through the protective circuit in FIG. 1 is 0.5 A (=Io2), and a current Isgf1 that flows from the source toward the gate of the FET F1 in FIG. 1 becomes 0.17 A, and a total surge current of Io3=0.67 A can flow. As a result, the ESD resistance of 1 kV in HBM can be achieved.

As a comparative example of this, a current-voltage characteristic when there is no resistor Ra (corresponding to FIG. 11C) is shown by a single-dot dashed line (woR) in FIG. 3E. When an HBM surge of 1 kV is applied to the gate of the FET F1, since there is no current limitation by the resistor Ra, the current Io2 at point B exceeds an allowable reverse current of 0.5 A of the diode Db1 as the voltage increases as shown by a single-dot dashed line (woR) in FIG. 3E, and reaches 0.67 A of a current Io3. As a result, the diode Db1 malfunctions.

(Effects of First Embodiment)

Figure 11A:
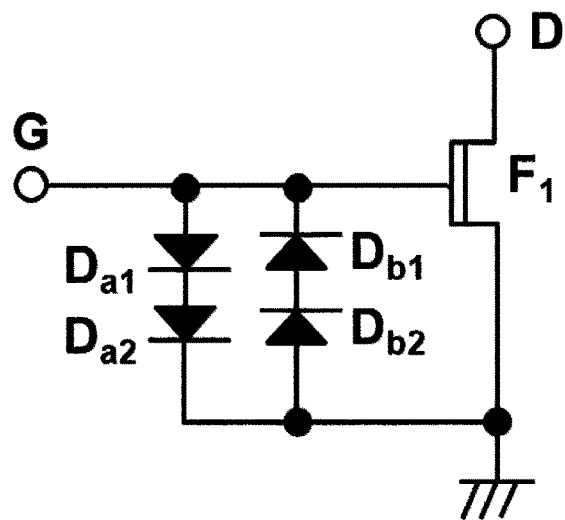
FIGS. 11A, 11B, and 11C are examples of circuit diagrams of conventional FETs with protection diodes connected between gate terminals and source terminals.
Figure 11B:
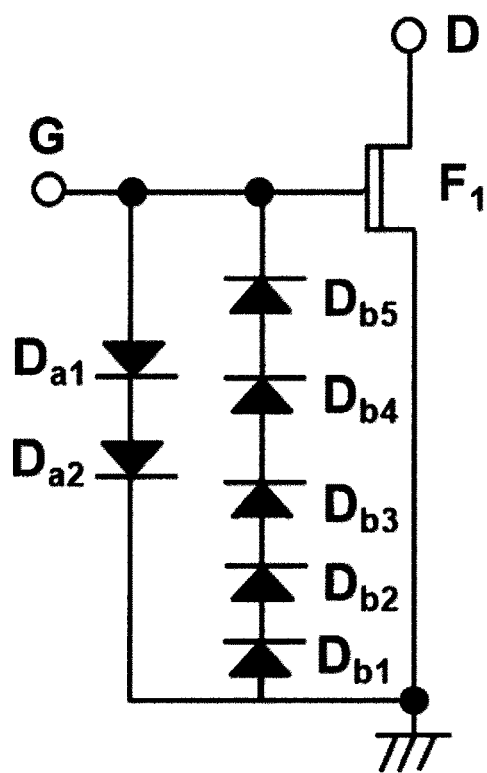
Figure 11C:
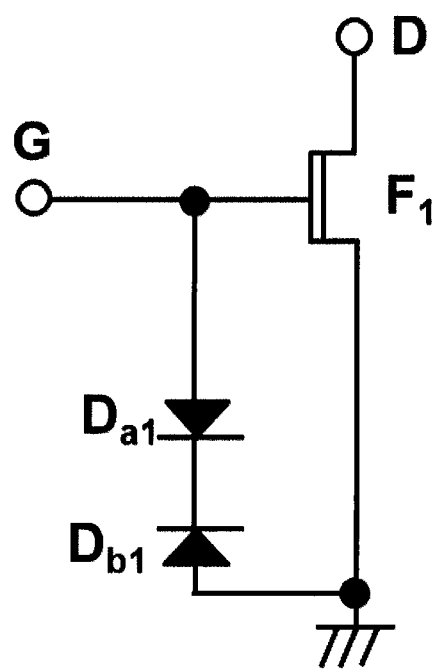

As described above, regarding the ESD resistance of the FET with protection diodes according to the first embodiment, the overall allowable reverse current can be increased by an amount corresponding to the allowable gate-source current of the F1 compared to the conventional case in FIG. 11C. In other words, when realizing the same ESD allowable surge current as that in FIG. 11C, it is possible to reduce the junction area of the protection diodes used for ESD by an amount corresponding to the allowable current of the F1. Furthermore, when implementing the protection diodes Da1 and Db1 using a Schottky junction, the diode and the channel resistor can be manufactured in the same step as the FET producing step, and no additional steps are involved, and it is therefore possible to achieve a cost reduction. Moreover, since an anti-series diode configuration is used, it is possible to reduce influences of parasitic capacitance and suppress a gain reduction of the FET amplifier by protection diode loading compared to the reverse parallel configuration in FIGS. 11A and 11B.

An example of a case has been described above where the Da1 and Db1 are manufactured using the same Schottky junction as that of the FET F1, but it is apparent that even when the Da1 and Db1 are formed of pn junction, the junction area of the protection diode can be reduced by an amount corresponding to the allowable current of the F1. The present embodiment has been described by taking a GaN FET as an example, but it is apparent that similar effects can also be expected for conventional GaAs FETs.

Second Embodiment

Figure 4:
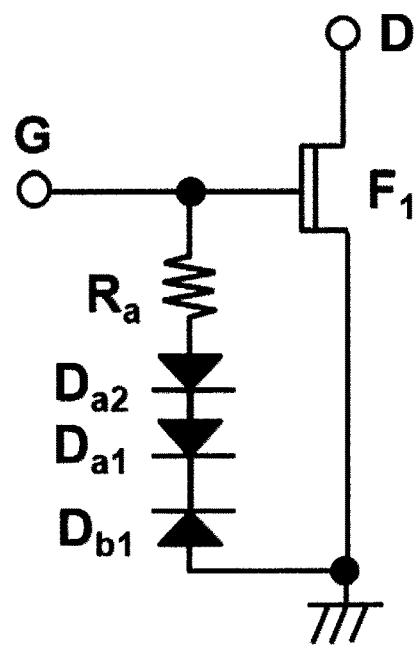
FIG. 4 is an example of a protective circuit according to a second embodiment of the present invention.

FIG. 4 is an example of a protective circuit according to a second embodiment of the present invention. A difference from FIG. 1 of the first embodiment is that a diode Db2 is connected in series to the Db1 in the same direction. Although the area of the diodes increases by an amount corresponding to the Db2, the number of diodes reversely biased when a negative gate bias is applied is incremented by one compared to FIG. 1 in the first embodiment, and influences of a parasitic capacitance by the protective circuit can be reduced by that amount. Other effects are the same as those of the first embodiment.

Third Embodiment

Figure 5:
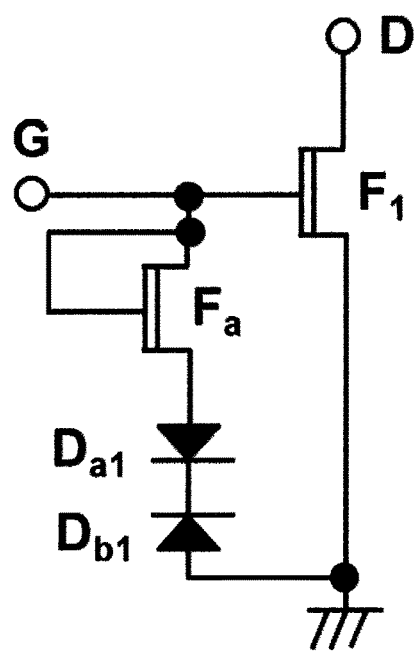
FIG. 5 is an example of a protective circuit according to a third embodiment of the present invention.

FIG. 5 is an example of a protective circuit according to a third embodiment of the present invention. A different from the drawing in the first embodiment is that the resistor Ra is replaced by a constant current source Fa in which a gate and a source of an FET are connected together. Since the constant current source Fa has the constant current characteristic shown in FIG. 3B as in the case of the channel resistor Ra, effects similar to those of the first embodiment can be expected.

Fourth Embodiment

Figure 6:
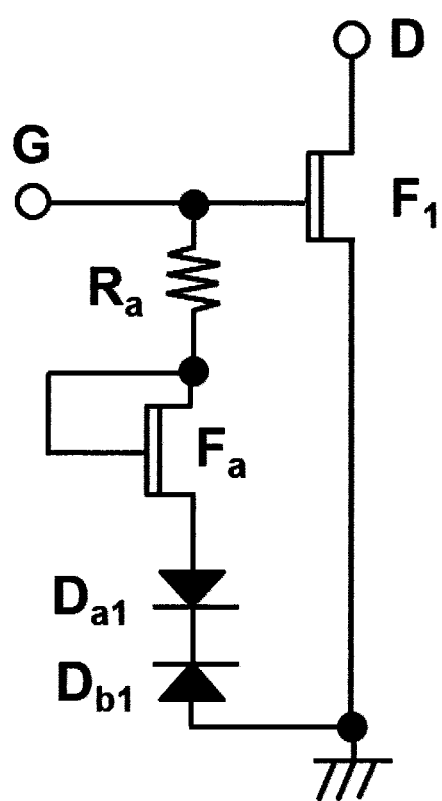
FIG. 6 is an example of a protective circuit according to a fourth embodiment of the present invention.

FIG. 6 is an example of a protective circuit according to a fourth embodiment of the present invention. This is a configuration in which the resistor Ra shown in FIG. 1 is added to FIG. 5 of the third embodiment. The addition of the channel resistor Ra can increase an impedance of the protective circuit compared to FIG. 5. Here, the current saturation characteristic deriving from the resistor Ra is set to be equivalent to the current saturation characteristic of the constant current source Fa. The impedance of the protective circuit is Sri increased by loading of the resistor Ra, and a gain reduction of the amplifier during amplification operation can be suppressed by an amount corresponding thereto compared to the third embodiment. Other effects are similar to those of the third embodiment.

Fifth Embodiment (Description of Configuration)

Figure 7B:
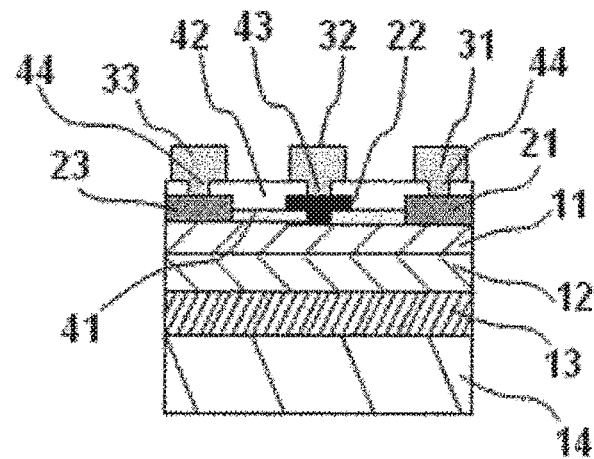
FIG. 7B is a cross-sectional view of a protection diode according to a fifth embodiment of the present invention.
Figure 7C:
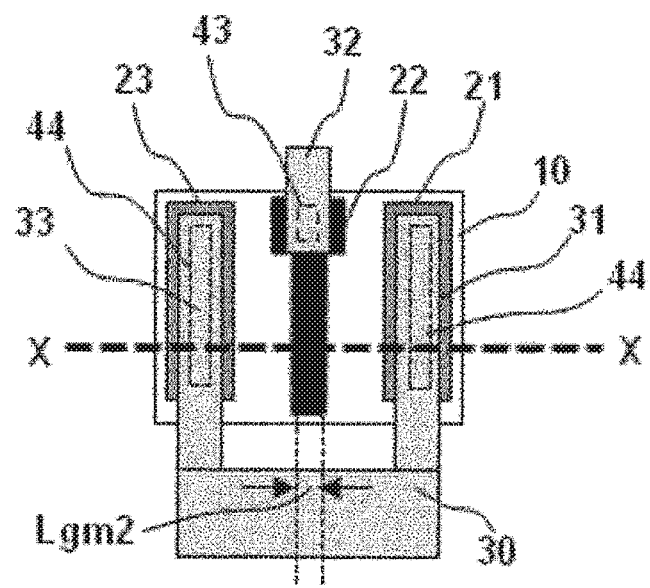
FIG. 7C is a layout diagram of a conventional diode.
Figure 7D:
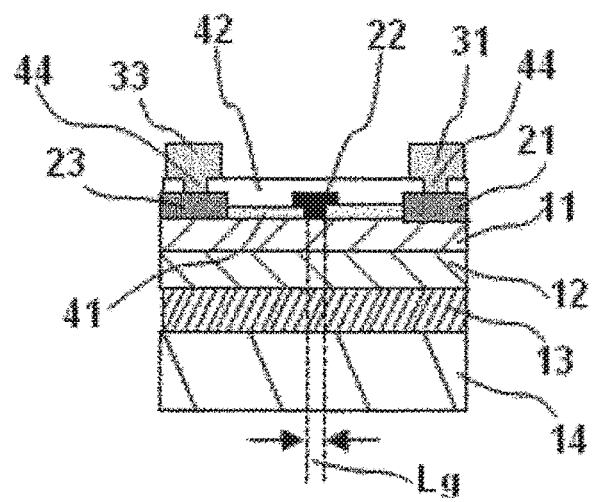
FIG. 7D is a cross-sectional view of a conventional diode.

The first to fourth embodiments have described aspects of the circuit configuration according to the present invention, and fifth to seventh embodiments will describe embodiments relating to a layout of the diode section which is a feature of the present invention. FIGS. 7A and 7B are a layout diagram and a cross-sectional view of a protection diode according to the fifth embodiment of the present invention. FIGS. 7C and 7D are a layout diagram and a cross-sectional view of a conventional diode. The circuit configuration of the protective circuit is assumed to correspond to any one of the first, second and fourth embodiments. Schottky junction diodes are normally often manufactured as shown in FIGS. 7C and 7D according to a layout of the FET. FIG. 7 is an example of a GaN FET. As shown in FIGS. 7C and 7D, the buffer layer 13 is provided on the semiconductor substrate 14 made of SiC or Si, and the GaN layer 12 and the AlGaN layer 11 are provided thereon.

The drain electrode 21, the gate electrode 22 and the source electrode 23 are provided on AlGaN inside an active region 10. To improve a withstand voltage, both ends of the gate electrode 22 are often stranded on the insulating film 41. The insulating film 42 covers the electrodes, the drain lead wire 31, which is the first layer wire, is connected to the drain electrode 21 via the contact hole 44 on the insulating film 42, the gate lead wire 32, which is the first layer wire, is connected to the gate electrode 22 via the contact hole 43 on the insulating film 42, and the source lead wire 33, which is the first layer wire, is connected to the source electrode 23 via the contact hole 44 on the insulating film 42. The first layer wire 30 is a wire to cause the drain and source lead wires 31 and 33 to have the same potential.

As is apparent from a comparison of FIG. 7A with FIG. 7C, the gate electrode 22 which is a Schottky junction diode of the present invention (may also be called an "anode electrode" because FIG. 7 illustrates a diode) is covered with the first layer wire 32 in substantially the same size. The contact hole 43 also has a large opening below the first layer wire. On the other hand, since the conventional Schottky junction diode may be configured into the same shape as the FET as shown in FIG. 7C, a contact hole is conventionally manufactured only at an end of the gate electrode 22 with an opening that satisfies its minimum opening size, and the length of a thin portion as shown by a width Lgm2 of the gate electrode 22 that plays an important role as the FET is shorter than a width Lgm1 in FIG. 7A. In the case of a microwave band FET, a gate length Lg as shown in FIGS. 7C and 7D is smaller than the minimum opening size of the contact hole 43 that normally connects the gate electrode 22 and the first layer wire. For this reason, the gate electrode 22 other than the end portion of the gate electrode 22 is never covered with the gate lead wire 32.

In the present invention, since a diode is used as the protection diode, it is necessary to pass a surge current several tens of times to several hundreds of times as large as that in normal operation through the gate electrode in a short time. For this reason, resistance of any parts other than the junction section is preferably minimized so as to pass the current through the Schottky junction as evenly as possible. For that purpose, it is effective to reduce the wiring resistance. This is because the surge current can more easily flow through the entire junction section and the allowable current increases as the evenness improves. From this viewpoint, it is appreciated that the wiring resistance in areas other than the junction section decreases in the layout in FIG. 7A according to the present invention rather than in FIG. 7C. A guideline for the sizes of the gate lead wire 32 and the contact hole 43 is that it is experimentally preferable that the gate electrode 22 should occupy ⅔ or more of the Schottky junction area. It should be additionally noted that, the effect of reducing wiring resistance is experimentally not much available when the gate electrode 22 occupies ⅓ or less of the Schottky junction area.

(Description of Effects)

As described above, the layout example of the protection diode according to the fifth embodiment has an effect of increasing the allowable reverse current of the diode itself when the first, second and fourth embodiments are actually implemented on a GaN chip. Increasing the allowable current has an effect of being able to prevent the junction area for unnecessary protection diodes from increasing and contributing to a reduction of the chip layout of the protective circuit.

Sixth Embodiment (Description of Configuration)

FIG. 8 is a layout example of a diode and an FET for describing a sixth embodiment. As described in the first embodiment, according to the present invention, in order to ensure that the protection diode Db1 is subjected to reverse breakdown, the reverse withstand voltage of the protection diode is preferably lower by on the order of 5 to 10 V than the gate-source reverse withstand voltage of the amplification FET F1. The sixth embodiment is an example of the layout technique of the diode and the FET that realizes the difference in the withstand voltage. As the circuit configuration of the protective circuit, the cases in FIGS. 1, 4, 5 and 6 according to the first fourth embodiments are assumed.

Figure 8A:
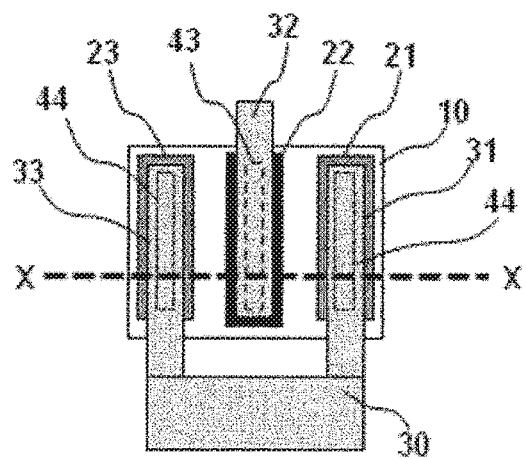
FIG. 8A is a top view of a protection diode according to a sixth embodiment of the present invention.
Figure 8B:
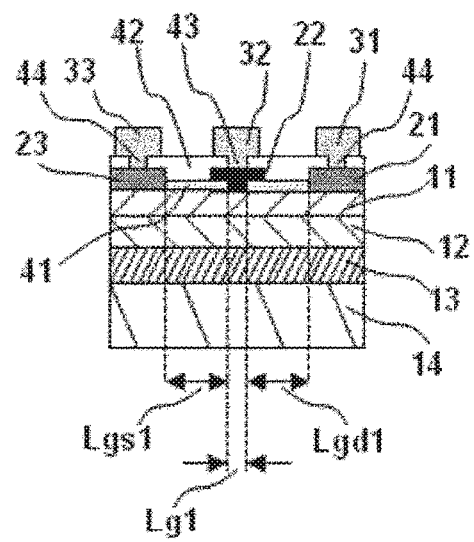
FIG. 8B is a cross-sectional view of a protection diode according to a sixth embodiment of the present invention.
Figure 8C:
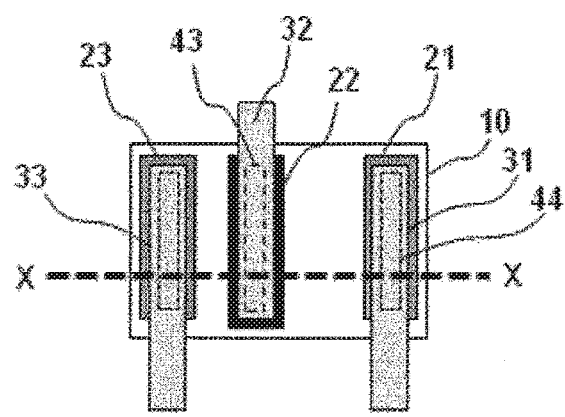
FIG. 8C is a top view of an amplification FET according to a sixth embodiment of the present invention.
Figure 8D:
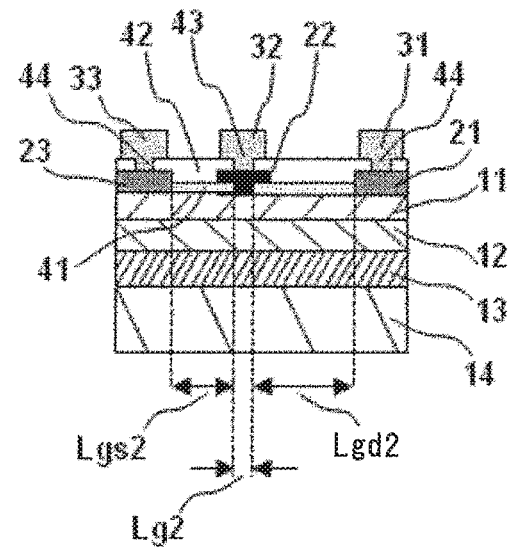
FIG. 8D is a cross-sectional view of an amplification FET according to a sixth embodiment of the present invention.

FIGS. 8A and 8B, and FIGS. 8C and 8D are examples of top views and cross-sectional views of the protection diode and the amplification FET respectively. As shown in FIGS. 8C and 8D, the layout of the amplification FET intended for high output often has a gate-drain interval Lgd2 greater than a gate-source interval Lgs2. This is because the layout is intended to increase the gate-drain withstand voltage to enable a high voltage operation. On the other hand, in the case of the diode, as shown in FIGS. 8A and 8B, a target structure with Lgs1=Lgd1 is preferable where the source resistance and the drain resistance are equalized so that a gate current flows, through the gate electrode, into the source side and the drain side equally.

An example has been shown in FIG. 8 where in order to implement a low withstand voltage protection diode, the gate-source electrode interval Lgs1 is made shorter than the gate-source electrode interval Lgs2 of the FET F1 and the withstand voltage of the protection diode Db1 is thereby made lower than the gate-source reverse withstand voltage of the FET F1. For example, when Lgs1 is experimentally made to be narrower by 0.2 to 0.5 μm than Lgs2, a reduction of withstand voltage by 5 to 10 V can be achieved. When a difference between Lgs1 and Lgs2 (Lgs1−Lgs2) is less than 0.2 μm, the difference from the gate-source reverse withstand voltage is less than 5 V, which means a shortage of margin when seen from the previous standpoint of causing the protection diode Db1 to undergo breakdown, which cannot be said to be desirable in terms of practicality. On the other hand, when the difference between Lgs1 and Lgs2 is 0.5 μm or greater, the difference in the withstand voltage becomes 10 V or greater, which is an excessive margin, but this does not mean that the effects of the present embodiment cannot be obtained.

(Description of Effects)

Since control on the withstand voltages by changing intervals can be implemented using only a mask pattern, such control provides an effect of being able to prevent a cost increase.

Note that an example has been shown in the present embodiment where a difference in the withstand voltages has been achieved by correcting a mask pattern, but the withstand voltage may be reduced using a method of changing the material of the gate electrode 22 or slightly embedding the gate electrode 22 in the AlGaN layer 11. It should be additionally noted that in the case of changing the gate electrode material or using an embedded structure, a mask step and a process step need to be added.

Seventh Embodiment (Description of Configuration and Effects)

Figure 9A:
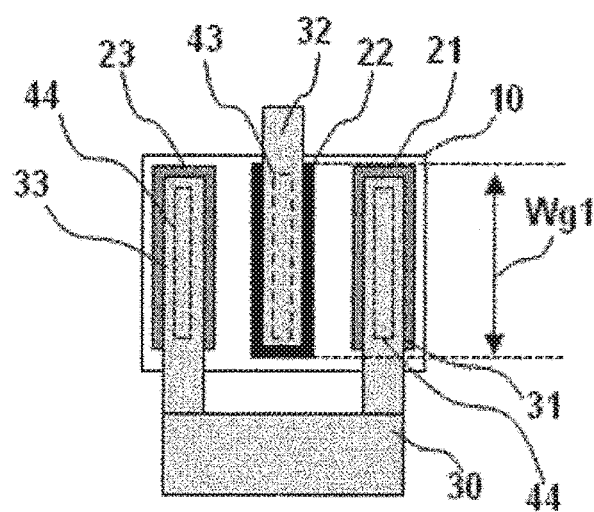
FIG. 9A is a layout example of the diode Db1 in FIG. 1.

A seventh embodiment relates to the Schottky junction area of the protection diodes Da1 and Db1 in FIG. 1 according to the first to sixth embodiments, and FIG. 9 shows a layout example of the Da1 and Db1. FIG. 9A is a layout example of the diode Db1 in FIG. 1 and FIG. 9B is a layout example of the diode Da1 in FIG. 1, Wg1 denotes a gate width of the diode Db1 and Wg2 denotes a gate width of the diode Da1. The Schottky junction area is represented by an overlapping area between the gate electrode 22 and the active region 10 in FIGS. 7A and 7B as described above.

When an allowable forward current of a diode is compared with an allowable reverse current, the allowable forward current is generally several times as great as the allowable reverse current. Therefore, when the first embodiment is actually expressed in the form of a chip layout, instead of implementing the diodes Da1 and Db1 with the same junction area, implementing the Da1 with a smaller area than the Db1 can improve the ESD resistance described in the first embodiment. The desired ESD resistance can be implemented even when the junction area of the Da1 is set to ½ to ¼ of that of the diode Db1, for example. In the examples in FIGS. 9A and 9B, the gate width Wg2 of the diode Da1 can be set to approximately ½ or less of the gate width Wg1 of the diode Db1, the layout area occupied by the circuit in FIG. 1 can be reduced by the amount corresponding to the reduced gate width of the Da1, thus allowing downsizing.

Thus, reducing the area of the Da1 to ½ to ¼ of the area of the diode Db1 has an effect of being able to reduce the occupancy area by the protective circuit compared to the ease where both are implemented with the same area.

Eighth Embodiment (Description of Configuration and Effects)

Figure 10:
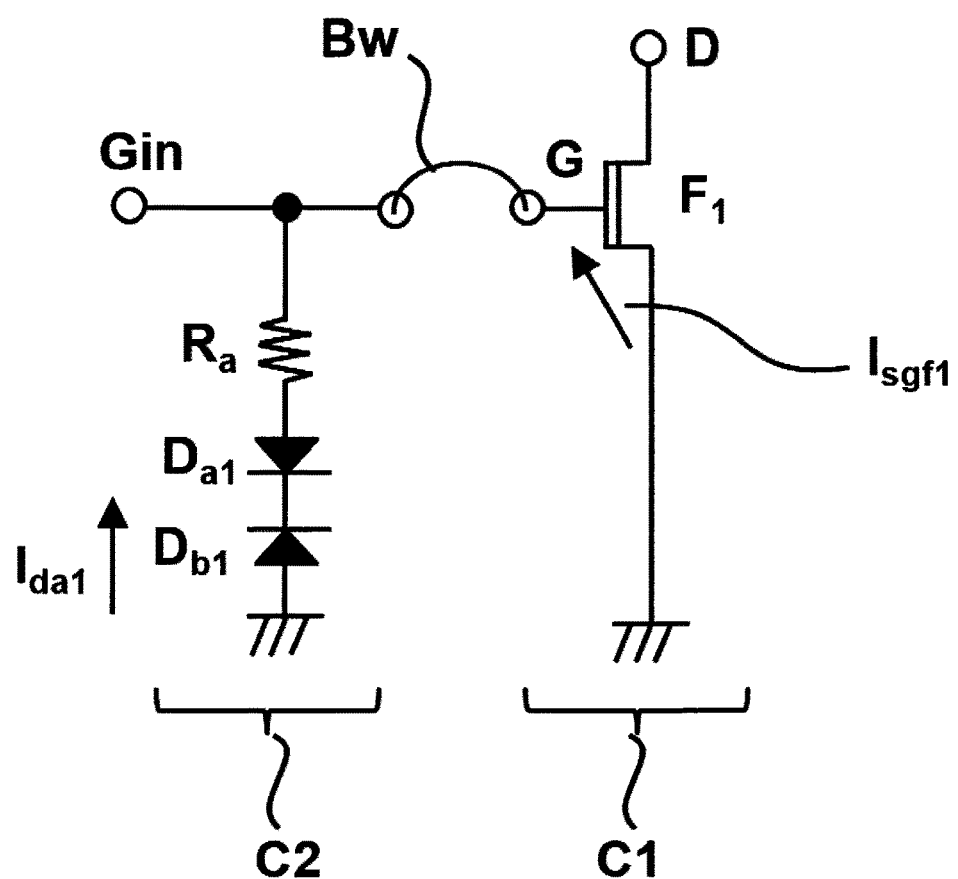
FIG. 10 is an example of a circuit diagram of an FET with protection diodes according to an eighth embodiment of the present invention.

An eighth embodiment is an example where the protective circuit section described in the first to fourth embodiments is implemented not on the same chip as the GaN FET but on another III-V group semiconductor substrate made of, for example, GaAs. FIG. 10 illustrates an example of a circuit diagram thereof. In the example in FIG. 10, the FET F1 is manufactured on a GaN substrate C1 and the protective circuit section made up of the diodes Da1 and Db1, and the resistor Ra is manufactured on a GaAs substrate C2. Both are connected together via a bonding wire Bw and constitute a circuit equivalent to that in FIG. 1.

SiC substrates widely used as epitaxial substrates capable of manufacturing a GaN BET have excellent low thermal resistance, but they are normally more expensive than GaAs substrates. A high output, high gain, high efficiency characteristic and low thermal resistance in a GHz band are not strongly required for a protective circuit section intended for ESD protection. Therefore, the present embodiment featuring the protective circuit section manufactured on a GaAs substrate, the FET manufactured on a GaN substrate, both of which are connected together via a wire or the like, is effective for cost reduction.

The effects described in the first to fourth embodiments can also be obtained even by manufacturing the FET F1 and the protective circuit on different semiconductor substrates as described above and connecting them via the bonding wire Bw. Furthermore, creating the chip on a GaAs substrate has an effect of being able to reduce the size of the GaN FET chip by art amount corresponding to the area occupied by the protective circuit and achieving a cost reduction. It goes without saying that in addition to the GaAs substrate, an InP substrate, a Si substrate, a sapphire substrate or the like are also applicable.

Obviously many modifications and variations of the present invention are possible light of the above teachings. It is therefore to be understood that within the scope of the appended claims the invention may he practiced otherwise than as specifically described, The entire disclosure of Japanese Patent Application No. 2016-022499, filed on Feb. 9, 2016 including specification, claims, drawings and summary, on which the Convention priority of the present application is based, is incorporated herein by reference in its entirety.

The invention claimed is:

1. A field-effect transistor with protection diodes, comprising:
   a field-effect transistor; and
   a two-terminal electrostatic protection circuit connected between a gate and a source of the field-effect transistor,
   wherein the two-terminal electrostatic protection circuit comprises:
   a first diode that is positioned on a reverse-biased side when a voltage lower than a potential of the source is applied to the gate and has a reverse withstand voltage lower than a reverse withstand voltage between the gate and the source of the field-effect transistor;
a second diode that is positioned on a forward-biased side when a voltage lower than a potential of the source is applied to the gate and is connected in anti-series to the first diode; and
a resistor that is connected in series to a diode pair comprising the first diode and the second diode, wherein the resistor is formed using a same channel layer as that of the field-effect transistor, the same channel layer in which the field-effect transistor and the resistor are formed comprising plural layers of different materials.

2. The field-effect transistor with protection diodes according to claim 1, wherein the first diode is connected in plurality in series with a same polarity in a direction in which a current flows.

3. The field-effect transistor with protection diodes according to claim 1, wherein a Schottky junction area of the second diode is within a range of ½ to ¼ of a Schottky junction area of the first diode.

4. The field-effect transistor with protection diodes according to claim 1, wherein in a layout of an anode electrode of the first diode, both an area of an overlapping portion between the anode electrode and a lead wire of the anode electrode and an area of a contact hole that connects the anode electrode to the lead wire occupy ⅔ or more of an area of the anode electrode.

5. The field-effect transistor with protection diodes according to claim 1, wherein the diode pair, the resistor and the field-effect transistor are manufactured on an identical III-V group semiconductor substrate.

6. The field-effect transistor with protection diodes according to claim 1, wherein the diode pair and the resistor are manufactured on a semiconductor substrate different from a semiconductor substrate on which the field-effect transistor is manufactured.

7. The field-effect transistor with protection diodes according to claim 1, wherein the field-effect transistor is a GaN field-effect transistor, and the diode pair and the resistor are manufactured on a GaAs or InP or Si or glass or sapphire substrate.

8. The field-effect transistor with protection diodes according to claim 1, wherein
the resistor is a channel resistor, and has a current saturation characteristic wherein current saturation caused by the current saturation characteristic is performed after reverse breakdown of the first or second diodes starts.

9. The field-effect transistor with protection diodes according to claim 1, wherein the plural layers comprise an AlGaN layer and a GaN layer.

10. A field-effect transistor with protection diodes, comprising:
a first field-effect transistor; and
a two-terminal electrostatic protection circuit connected between a first gate and a first source of the first field-effect transistor,
wherein the two-terminal electrostatic protection circuit comprises:
a first diode that is positioned on a reverse-biased side when a voltage lower than a potential of the first source is applied to the first gate and has a reverse withstand voltage lower than a reverse withstand voltage between the first gate and the first source of the first field-effect transistor;
a second diode that is positioned on a forward-biased side when a voltage lower than a potential of the first source is applied to the first gate and is connected in anti-series to the first diode;
a second field-effect transistor that is connected in series to a diode pair comprising the first diode and the second diode and has a second gate and a second source which are connected to each other; and
a resistor formed using a same channel layer as that of the first field-effect transistor and connected in series to the two-terminal electrostatic protection circuit, the same channel layer in which the first field-effect transistor and the resistor are formed comprising plural layers of different materials.

11. The field-effect transistor with protection diodes according to claim 10, wherein a Schottky junction area of the second diode is within a range of ½ to ¼ of a Schottky junction area of the first diode.

12. The field-effect transistor with protection diodes according to claim 10, wherein in a layout of an anode electrode of the first diode, both an area of an overlapping portion between the anode electrode and a lead wire of the anode electrode and an area of a contact hole that connects the anode electrode to the lead wire occupy ⅔ or more of an area of the anode electrode.

13. The field-effect transistor with protection diodes according to claim 10, wherein the diode pair, and the first field-effect transistor, and the second field-effect transistor are manufactured on an identical III-V group semiconductor substrate.

14. The field-effect transistor with protection diodes according to claim 10, wherein the diode pair and the second field-effect transistor are manufactured on a semiconductor substrate different from a semiconductor substrate on which the first field-effect transistor is manufactured.

15. The field-effect transistor with protection diodes according to claim 10, wherein the first field-effect transistor is a GaN field-effect transistor, and the diode pair and the second field-effect transistor are manufactured on a GaAs or InP or Si or glass or sapphire substrate.

16. The field-effect transistor with protection diodes according to claim 10, wherein
the second field-effect transistor has a current saturation characteristic wherein current saturation caused by the current saturation characteristic is performed after reverse breakdown of the first or second diodes starts.

17. The field-effect transistor with protection diodes according to claim 10, wherein plural layers comprise an AlGaN layer and a GaN layer.

* * * * *